(12) United States Patent
Joshi et al.

(10) Patent No.: US 6,246,132 B1
(45) Date of Patent: Jun. 12, 2001

(54) MAGNETOSTRICTIVE ACTUATOR

(75) Inventors: Chandrashekhar H. Joshi, Bedford; Bruce R. Bent, Scituate, both of MA (US)

(73) Assignee: Energen, Inc., Billerica, MA (US)

( * ) Notice: Subject to any disclaimer, the term of this patent is extended or adjusted under 35 U.S.C. 154(b) by 0 days.

(21) Appl. No.: 09/222,449

(22) Filed: Dec. 29, 1998

Related U.S. Application Data

(60) Provisional application No. 60/072,547, filed on Jan. 26, 1998.

(51) Int. Cl.[7] ....................................................... H02N 2/04

(52) U.S. Cl. ................................................. 310/26; 318/118

(58) Field of Search ............................... 310/26; 335/215; 318/118

(56) References Cited

U.S. PATENT DOCUMENTS

| | | | |
|---|---|---|---|
| 4,754,441 | * 6/1988 | Butler | 310/26 X |
| 5,249,117 | * 9/1993 | Greenough et al. | 310/26 X |
| 5,281,875 | * 1/1994 | Kiesewetter et al. | 310/26 |
| 5,693,154 | * 12/1997 | Clark et al. | 310/26 X |
| 5,739,601 | * 4/1998 | Tsodikov | 310/26 |

* cited by examiner

Primary Examiner—Nestor Ramirez
Assistant Examiner—Judson H. Jones
(74) Attorney, Agent, or Firm—Brian M. Dingman

(57) ABSTRACT

A magnetostrictive actuator, comprising: a magnetostrictive member which elongates upon application of a magnetic field; a translating member mechanically coupled to the magnetostrictive member, for translating the change in length of the magnetostrictive member into a desired action; and a selectively-energized coil surrounding the magnetostrictive member, to apply a magnetic field to the magnetostrictive member, and thus selectively change the length of the magnetostrictive member, and thereby cause the translating member to create the desired action.

6 Claims, 17 Drawing Sheets

MAGNETOSTRICTIVE ACTUATOR

CROSS REFERENCE TO RELATED APPLICATION

This application is a continuation in part of Provisional Application No. 60/072,547, filed on Jan. 26, 1998.

FIELD OF THE INVENTION

This invention relates to magnetostrictive actuators which provide position control over very small, or larger, distances, and which provide force control.

BACKGROUND OF THE INVENTION

Cryogenic shape and force actuators are required for NASA's Next Generation Space Telescope (NGST). The shape control actuator must provide a small stroke in a rigid structure whereas the force control actuator must provide a controlled force through a small displacement, imposed on a somewhat compliant optical surface. Solenoids can only pull, and thus require a separate return mechanism. Also, since solenoids have moving parts, they are not sufficiently reliable, repeatable, or precise.

SUMMARY OF THE INVENTION

The design of the inventive actuators of this invention incorporate cryogenic magnetostrictive materials. The preferred magnetostrictive material has the highest strains at cryogenic temperatures. These strains, which approach 0.63%, exceed that available from piezoelectric materials at the design operating temperatures for the NGST of between 20 and 60 K. Also, the invention employs electrical coils for providing the controlled strength magnetic field applied to the magnetostrictive material, to cause elongation of the material, and resultant desired movement. In an embodiment for low temperature operation in an environment in which heat dissipation and power use must be minimized, as in the NGST, high temperature superconducting wire is used to apply the magnetic field to the magnetostrictive materials. At the operating temperatures specified, superconducting wire exhibits zero resistance and therefore generates no heat in the actuator during activation. This minimizes any thermal interference with the optical surfaces to which the actuators will be attached in the NGST. The only source of heat generation is found in the internal resistance of the drive electronics.

The current flowing to the actuator is the most critical aspect of the ability to control the precision shaping and positioning of the optical surfaces of the NGST. In order to meet this requirement, a unique actuator control system based on industry standard electronics, operated at cryogenic conditions, is utilized. This cryogenic operation reduces internal resistance by a factor of between 15–30 and provides the actuators with a high efficiency current source with a 10-ppm accuracy.

It is therefore an object of this invention to provide a magnetostrictive actuator.

It is a further object of this invention to provide such a magnetostrictive actuator which can be used as a shape controller.

It is a further object of this invention to provide such a magnetostrictive actuator which can be used as a linear motor.

It is a further object of this invention to provide such a magnetostrictive actuator which can be used as a force applicator.

It is a further object of this invention to provide such a magnetostrictive actuator which can move in very small increments, but across a relatively large distance.

It is a further object of this invention to provide such a magnetostrictive actuator which is very reliable.

It is a further object of this invention to provide such a magnetostrictive actuator which is very repeatable.

It is a further object of this invention to provide such a magnetostrictive actuator which is very precise.

It is a further object of this invention to provide such a magnetostrictive actuator which does not have moving parts.

This invention features a magnetostrictive actuator comprising a magnetostrictive member which elongates upon application of a magnetic field, and a translating member mechanically coupled to the magnetostrictive member, for translating the change in length of the magnetostrictive member into a desired action. There is further included a means for selectively applying a magnetic field to the magnetostrictive member, to selectively change the length of the magnetostrictive member and thereby cause the translating member to create the desired action.

The magnetostrictive member may be a rod with a desired cross-sectional shape (e.g. round or rectangular), which may be accomplished in a number of rod sections which are rigidly coupled together. This allows the use of a rod which is longer than a single rod which can be fabricated by current magnetostrictive material production techniques, in order to produce larger motions.

The actuator preferably includes a means for applying a compressive force to the magnetostrictive member, to align the magnetic moments in the member. This means may be accomplished with a compressed spring or any other similar device which applies force to the member.

The means for selectively applying a magnetic field may itself be accomplished with an electrical coil (such as a superconducting coil) surrounding the magnetostrictive member, and a means for applying a selected current to the coil, to generate an electromagnetic field with a selected field strength. The device may also include a magnetic return path structure substantially surrounding the coil, and coupled to the magnetostrictive member, to increase the magnetic coupling between the coil and the magnetostrictive member. The magnetic return path structure may contain material having a permanent magnetization.

This invention may be used to accomplish a linear motor, which can move in discrete steps of variable size. To accomplish this, the actuator includes a mechanical member coupled to the magnetostrictive member, which moves when the magnetostrictive member changes in length. Some means for holding this mechanical member in place (relative to the outside world) is also included. Such may be accomplished with a releasable clamp. A discrete movement of the mechanical member is accomplished by immersing the magnetostrictive member in a magnetic field while the clamp is released, and then closing the clamp before removing the magnetic field. In a preferred embodiment of a linear motor, the translating member is accomplished with rods or other protruding mechanical members coupled to each end of the magnetostrictive member. These protruding mechanical members translate a change in length of the magnetostrictive member into a change in their position. To accomplish maximum linear motion, these mechanical members are axially aligned, and are aligned along the major axis of motion of the magnetostrictive member.

The clamps can themselves be magnetostrictively actuated, and adapted to grip and release a protruding mechanical member as they are operated from a clamping position which holds the mechanical member in place, to a released position which allows the mechanical member to move. In this embodiment, the clamps can be adapted to grip when they are in the "power off" mode.

This invention also features a translating member which includes means for translating the change of length of the magnetostrictive member into a force output. This may be accomplished with a spring member such as a flat spring, which translates displacement into force. The flat spring may include a plurality of spring arms emanating from a central spring body. There may further be included a means for mechanically coupling the magnetostrictive member to the distal ends of these spring arms. In this case, the force translation may be provided with a mechanical member coupled to the central spring body. The force actuator may further include means for controlling the magnetostrictive member to provide a desired force. This may be accomplished with a means for sensing the force output, and means, responsive to such sensing, for controlling the field strength of the magnetic field applied to the magnetostrictive member, to control the change in length of the magnetostrictive member.

DETAILED DESCRIPTION OF THE PREFERRED EMBODIMENTS

Figure 1:
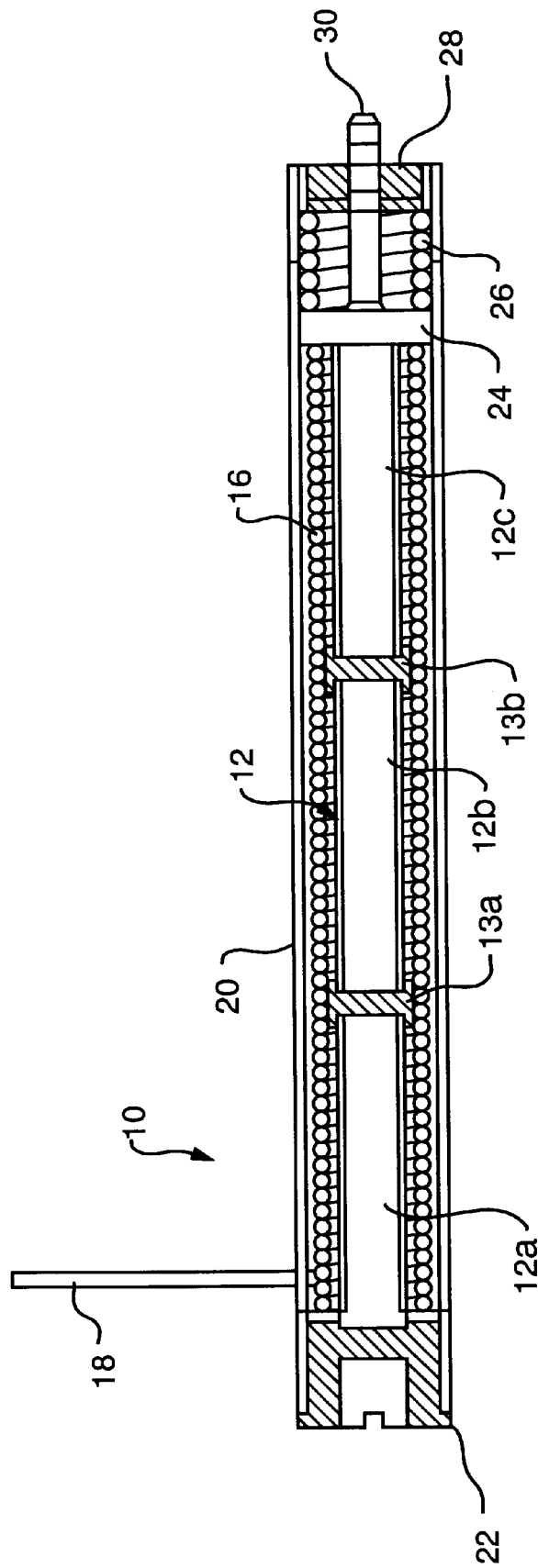
FIG. 1 is a cross-sectional assembly drawing of an embodiment of the magnetostrictive actuator of this invention.
Figure 2:
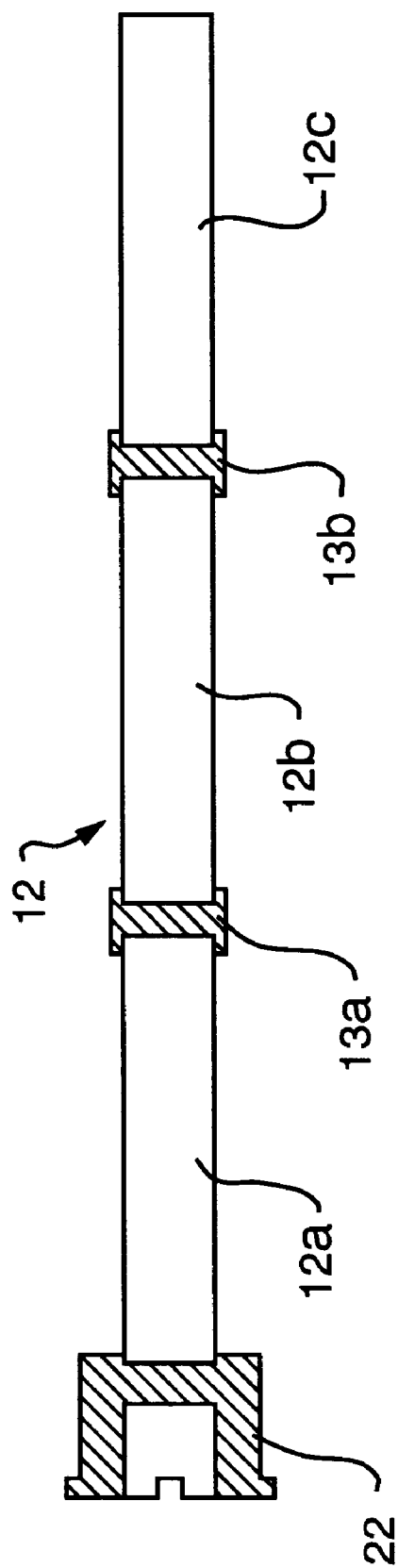
FIG. 2 is an assembly drawing of the magnetostrictive member of the actuator of FIG. 1.
Figure 3:
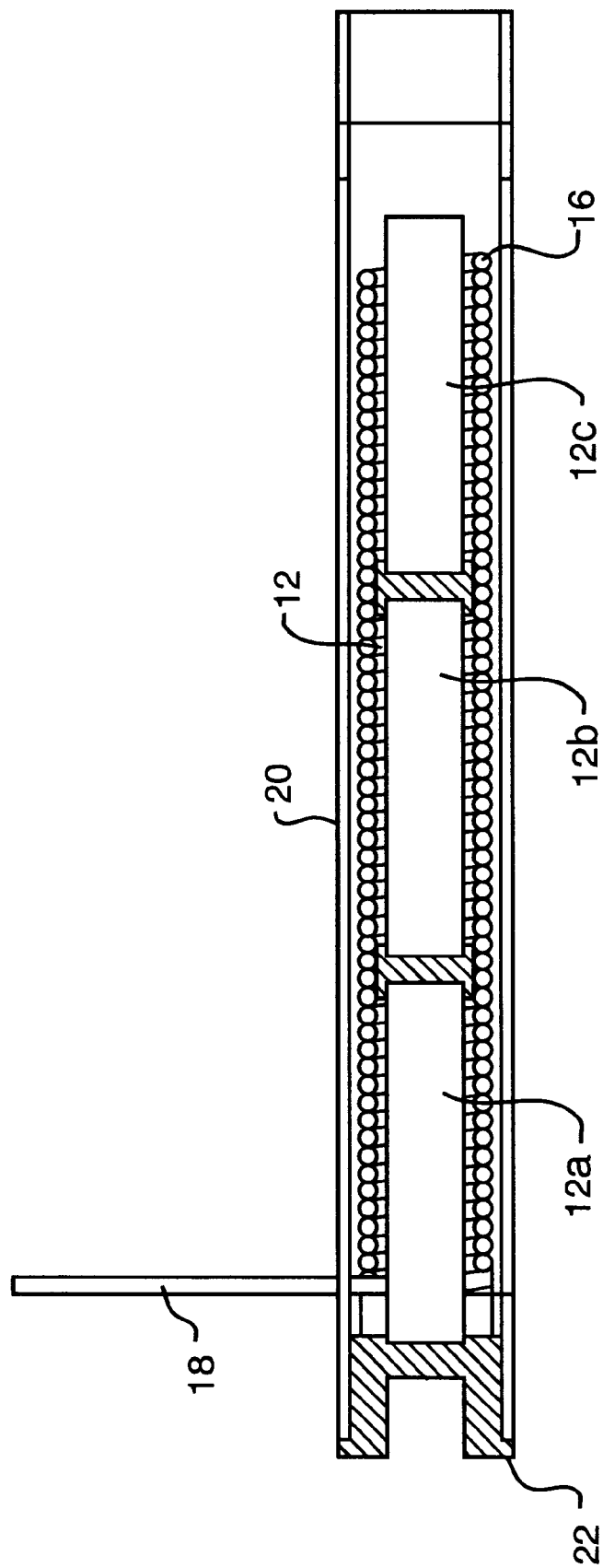
FIG. 3 is a cross sectional assembly drawing of the actuator sub-assembly of the actuator of FIG. 1.

This invention features in one embodiment a magnetostrictive actuator 10 (which may be used as an NGST mirror shape control actuator), shown in FIGS. 1–3. Actuator 10 consists of a magnetostrictive member 12 surrounded by a coil 16, which for low power loss and heat dissipation applications can be a superconducting coil, but in traditional applications can be made from copper wire or equivalent. Member 12 may be an elongated rod having a desired cross-sectional shape (e.g., round or rectangular). When coil 16 is energized by a current, the resulting magnetic field which envelops member 12 causes an elongation of the magnetostrictive member 12. The magnetic field when activated causes a realignment of the magnetic moments within the magnetostrictive material, generating an increase in length, and generating the force capability required. A magnetic return path may be used to increase the coupling between the coil and the magnetostrictive member.

FIG. 1 is an assembly drawing of the actuator 10. The magnetostrictive rod assembly 12 in the design is composed of three identical lengths of magnetostrictive rods (12a, 12b, and 12c) rigidly joined together by two spacers 13a and 13b, FIG. 2. The rod ends are epoxied into the spacers forming a single uniform rod 12 that generates the displacement and force. The spacers are fabricated from invar or other ferromagnetic material, and become an integral component of the magnetic return path. Obviously, any number of rods (one or more) connected in this manner as necessary can be used in the invention.

A magnetostrictive material having the desired mechanical and magnetostrictive properties for the particular application may be selected. In the preferred embodiment herein, the $Tb_{1-x}Dy_xZn$ alloy magnetostrictor is selected for high power/high strain applications at temperatures below ~200 K. The magnetostriction of this alloy is comparable to the huge magnetostriction of the rare earth elements Tb and Dy themselves (~0.5% at 77 K) and are not as ductile or as difficult to prepare. For the rare earth elements, orientation is very important, since the magnetization remains essentially in the basal plane for all practical magnetic fields. Crystallites oriented in directions out of the plane produce almost no magnetostriction. To date, only small single crystals have been suitably prepared with the appropriate field and stress axes properly oriented. For $Tb_{1-x}Dy_xZn$, orientation is also very important since $\lambda_{100} > \lambda_{111}$, To achieve the highest magnetostriction, the field and stress axes should be [100]. Single crystals of practical size of $Tb_{1-x}Dy_xZn$ are far easier to prepare than those of TbDy or Terfenol. Bridgman growth is possible and the preferred growth axis is near [100]. Extensive research has been carried out on both the $Tb_{1-x}Dy_xZn$ and the $Tb_{1-x}Dy_x$ alloys by the Magnetic Materials Group at the Naval Surface Warfare Center (NSWC), Silver Spring, Md. The NSWC magnetic materials group has also shown (unpublished) that the mechanical properties of $Tb_{1-x}Dy_xZn$ are far superior to those of the $Tb_{1-x}Dy_x$ alloy.

Four compositions of the $Tb_{1-x}Dy_xZn$ family of magnetostrictors have been evaluated herein at 4.2 K. These were: TbZn, $Tb_{0.4}Dy_{0.6}Zn$, $Tb_{0.6}Dy_{0.4}Zn$, and DyZn. Of the four materials, the TbDyZn family exhibits the best and most desirable qualities for a magnetostrictive actuator. It has the strength to perform the task, unlike TbDy, which has a strength comparable to that of lead. The material does not exhibit the brittleness of the Terfenol family. It also provides a growth rate when activated (5000 ppm), that is only slightly less than that of TbDy (6300 ppm).

The shell 20, load screw 28, push rod 30, and end cap 22 which surround the magnetostrictive rod assembly and coil, are fabricated from invar or another ferromagnetic material. These components also constitute elements of the magnetic field circuit, as well as providing the external support to the actuator. The push rod 30 is the contacting member with the outside world, and provides the mechanical interconnection through which the displacement and force are transmitted.

Spring 26, located between load screw 28 and inner flange 24 of push rod 30, is fabricated from stainless steel. This spring provides the preloading condition that aligns the magnetic moments in the magnetostrictive rods, which results in the proper elongation of the magnetostrictive rods when the magnetic field is applied. The application of the preload causes the magnetic moments to lay themselves in a plane perpendicular to the preload direction. The applied magnetic field causes these moments to realign with the magnetic field direction. This realignment of the magnetic moments results in the elongation of the magnetostrictive rod. Without a preload force (whether created by a spring or any other means for creating a compressive force on the magnetostrictor), the elongation would be diminished. Accordingly, use of a compressive force is preferred.

The coil utilized in the actuator 10, when it is a superconductor, is preferably composed of silver BSSCO alloy fabricated in a multifilament powder in tube process. Other material compositions may be used to fabricate the coil, for other temperature regimes. The coil is wound and insulated over an inert material mandrel prior to the final heat treatment. The coil is secured to end plug 22 using a high strength epoxy and floats over the outside surface of the magnetostrictive rods.

The assembly of actuator 10 is as follows. The magnetostrictive rod assembly (12a–c and 13a and b, FIG. 2) is epoxied into the socket located within end plug 22 for this purpose. The coil, after being wound and heat treated is placed onto the end plug, aligned with a centering mandrel, and epoxied onto the end plug. The electrical leads 18 from the coil are passed through slots located in the shell or end plug. The externally threaded end plug is then screwed into the internally threaded actuator shell 20, and is secured with a light coating of epoxy applied to the threads. The push rod is placed inside the shell resting against the end of the magnetostrictive rod assembly with its threaded end 30 protruding from the shell. The spring 26 is then dropped into place against the inner flange 24 of the push rod, and the externally threaded load screw 28 is started onto the inner threads at the end of the shell 20. A light coating of epoxy is placed on the threads and the load screw turned in by hand until secure contact is made against the spring. The load screw is then threaded into the end plug until the number of turns of the screw generates the required preload condition at the end of the magnetostrictive rods. The terminations of the coil are attached to a set of leads connecting to the drive electronics. These leads are then encapsulated in an RTV Silastic type of flexible compound and shrink tubing is placed over the entire lead area to provide a strain relief system.

Figure 4:
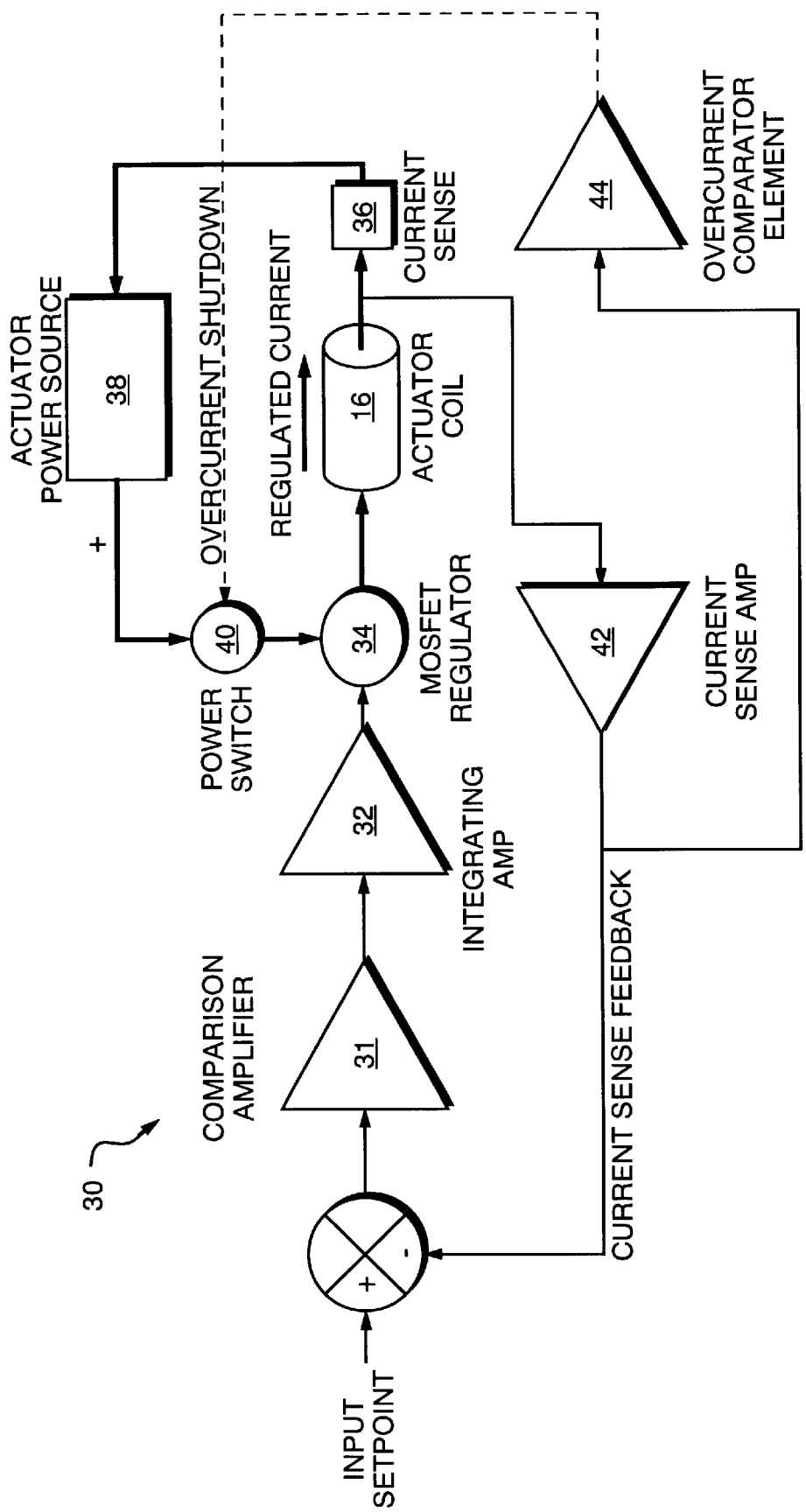
FIG. 4 is a block diagram of the preferred embodiment of the current regulator for the actuator of FIG. 1.

Critical to achieving a positioning resolution is precision control of the drive current. The drive electronics for this actuator consists of two parts—a DC/DC converter (not shown in the drawings, and needed only if a precision voltage is not available), and a current regulator 30 as shown in FIG. 4.

For use in the NGST, it is assumed that the power source for the actuator is a solar array that provides power at a moderate voltage 50–200 V DC. To minimize the power required to drive the actuator, a DC/DC converter brings the solar array voltage to a low level (less than 0.2 V) utilizing a switch-mode converter operating at cryogenic temperatures. Such conversions can be made at 99% efficiency by taking advantage of the greatly reduced conduction losses in MOSFET transistors at cryogenic temperatures. Such converters are being developed for the Dept. of Defense for operation at 240 K for megawatt-level power systems.

The current regulator 30 provides open loop control of the current flowing though the actuator coil 16. It is assumed that an external control loop, not shown, will provide the input setpoint to the actuator control.

The current regulator has an internal feedback mechanism to stabilize the current at the setpoint. The input setpoint is a voltage signal (0–5 V typical) where full-scale input corresponds to maximum coil current. A current sense element 36 is used to measure the current flowing through the coil.

A secondary comparator 44 provides independent over-current protection. This circuit will turn off the current to the coil using switch 40 if it for any reason exceeds a predefined limit.

An input set-point command signal (0 to +5VDC nominal) referred to circuit common is input and compared with a feedback signal in a comparison amplifier 31. The amplified error signal is integrated 32 to produce a gate drive signal for the MOSFET regulator 34. The power switch 40 acts as a voltage controlled current source to regulate the current through actuator coil 16. A sense resistor 36 senses the current and this signal is amplified 42 to produce the feedback signal proportional to coil current.

All amplifiers are commercially available CMOS process designs. The feedback sense amplifier is a CMOS auto-zeroing chopper stabilized amplifier chosen to reduce offset and offset drift in the feedback path to negligible magnitude. Power supply rails are +/−6V DC, with the common GND identical to that of the input actuator potential return in a star ground connection. In this respect, the split rail accuracy of the dual supply is not critical so long as all current regulator circuits have a midpoint common to the ground potential of the actuator low voltage supply return. The set-point input can be made a current input, or a different voltage range (0 to +10V) as required by system requirements.

The current regulator control circuitry can be packaged in SMT space qualified form. The power regulating MOSFET element, dependent upon system cooling availability and the maximum power dissipation, can likewise be obtained in an SMT package. There exist several advantages to the operation of the MOSFET at cryogenic temperatures, one of which is that the transconductance is increased with an effective reduction of drain to source on-resistance at a specified gate to source drive voltage. This implies that gate drive potential swings necessary to achieve regulation range in the loop are reduced. This keeps the integrating drive amplifier well in its linear range. The operation at low temperature likewise permits operating at low junction temperature (only a few degrees above the case temperature) with associated reliability increases. In other words, package dissipation can be increased without compromising operating junction temperature. Trace cross sections and wiring can be scaled down due to the lower resistivity (ca. one eighth) of copper in the range 20K to 60K. Thus, dense packaging is enabled by the low temperature operation. Roughly isothermal operation reduces temperature-induced drift of component values and should necessitate little to no compensation.

Figure 5:
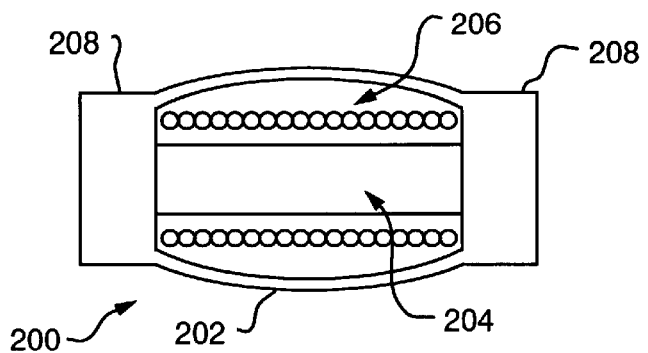
FIGS. 5–7 are schematic cross-sectional diagrams of alternative magnetostrictive actuators of this invention.
Figure 6:
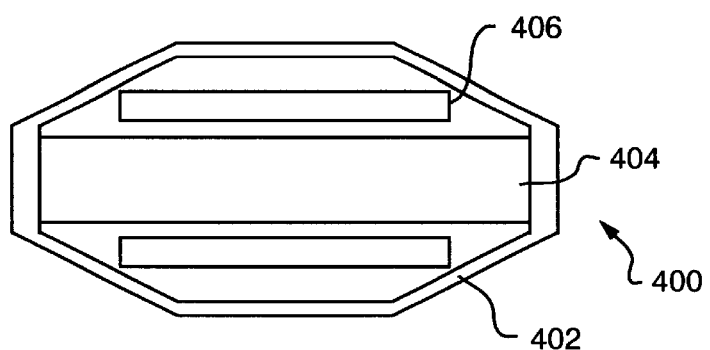
Figure 7:
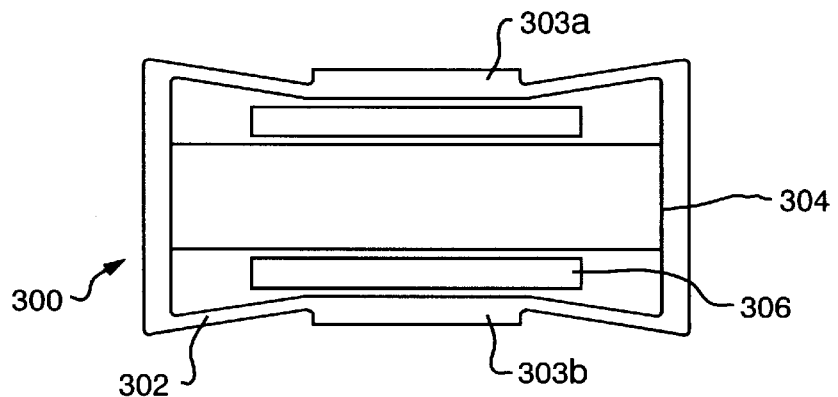

FIGS. 5–7 are schematic, cross-sectional views of alternative actuators of this invention. Actuator 200, FIG. 5, includes magnetostrictive member 204 mounted between end plates 208, and surrounded by coil 206. End plates 208 are joined together by one or more leaf springs 202, which mechanically amplify the motion of the magnetostrictive member. The geometry of the leaf springs varies the amount of the mechanical amplification. When the actuator pushes on the end plates, the span of the leaf springs is increased, causing their bow to decrease. The amount of the bow change that occurs is greater than the increase in span.

Other geometries for the leaf springs and actuators are shown in FIGS. 6 and 7. Actuator 400, FIG. 6, includes shell 402 which accomplishes both the end plates and the leaf springs. Actuator 300, FIG. 7, includes a bow tie-shaped shell 302. In this case, when the actuator is energized, causing magnetostrictive member 304 to elongate, leaf spring faces 303 a and b move away from one another.

Figure 8:
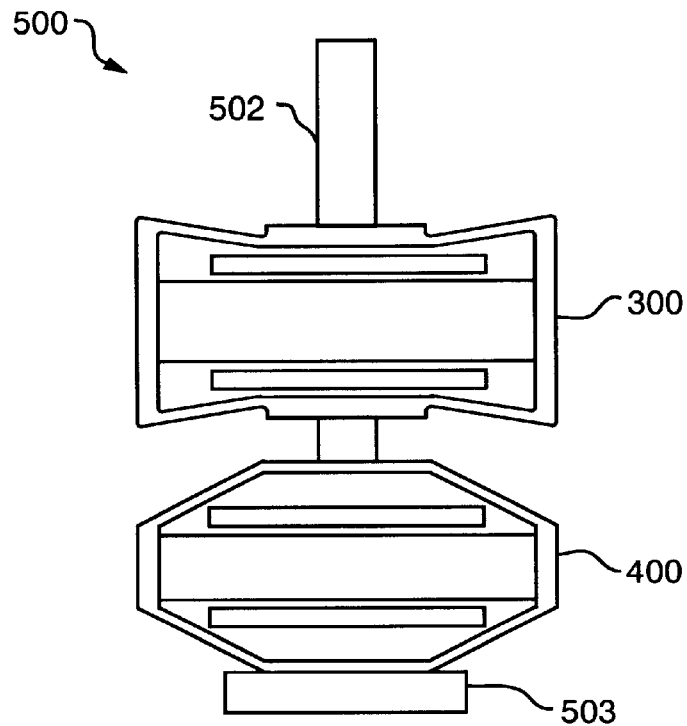
FIG. 8 is a schematic cross-sectional diagram of a magnetic actuator of this invention using the actuators of FIG. 6 and 7.

The actuators in FIGS. 6 and 7 can be combined to form a push-pull actuator 500, FIG. 8. Mechanical member 502 can be moved away from base 503 by energizing actuator 300, and the opposite action can be accomplished by energizing actuator 400.

Figure 9:
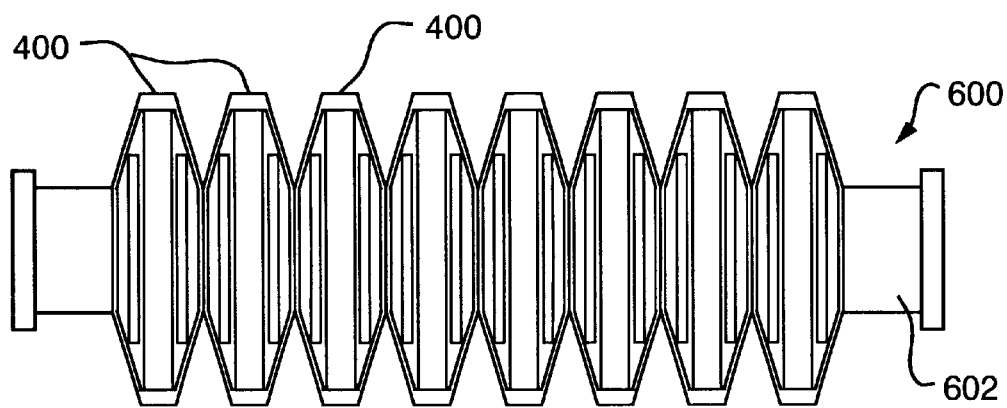
FIG. 9 is a schematic cross-sectional diagram of a magnetic actuator of this invention for accomplishing a longer actuator stroke.

The stroke length of the actuator can be increased by the use of a number of actuators mechanically coupled together, such as shown in FIG. 9, wherein actuator 600 includes a number of actuators 400 connected together side by side. The overall change in length is equal to the change in width of a single actuator 400, times the number of such actuators in the assembly.

Figure 10A:
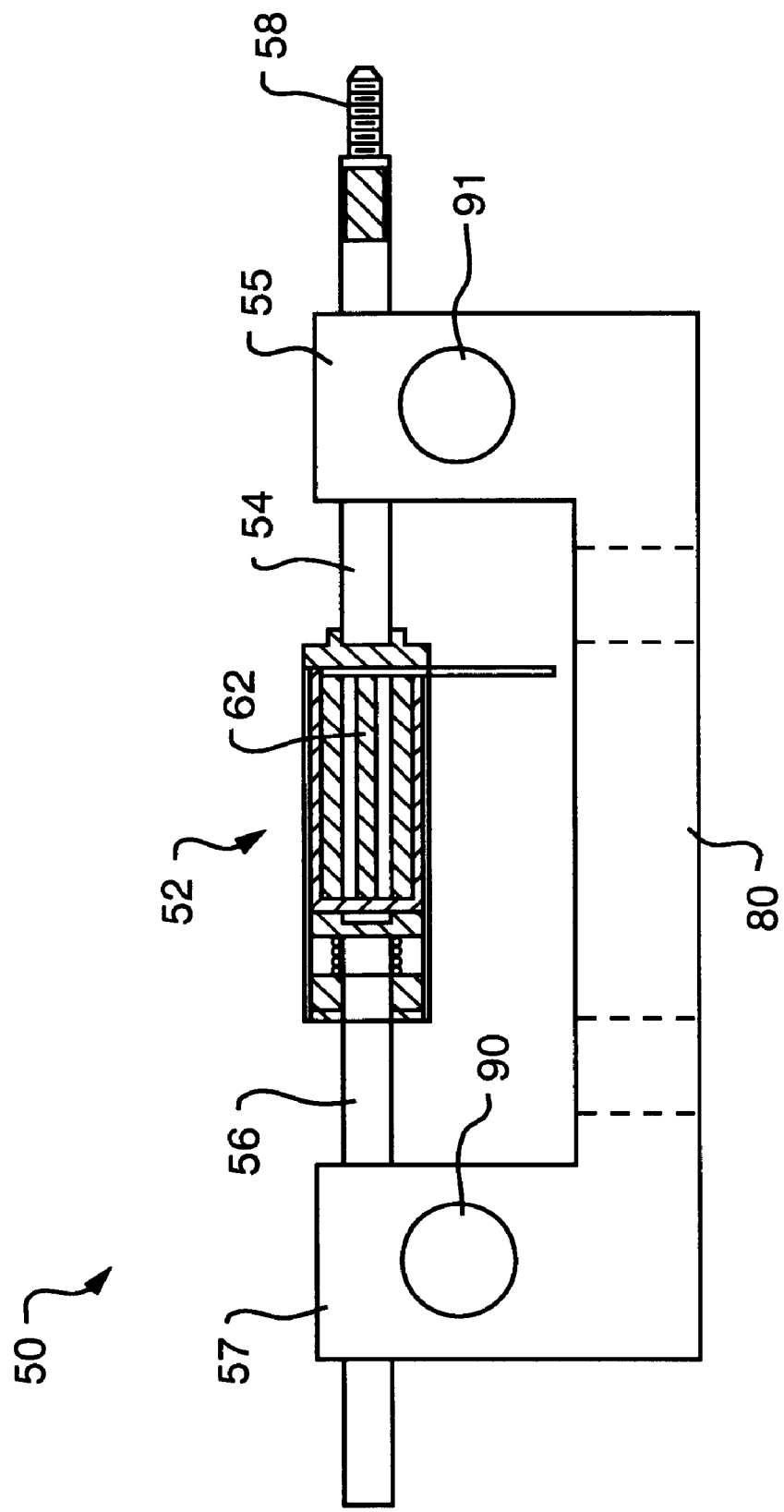
FIGS. 10A–C are side, top and end cross-sectional diagrams, respectively, of a linear motor according to this invention.
Figure 10B:
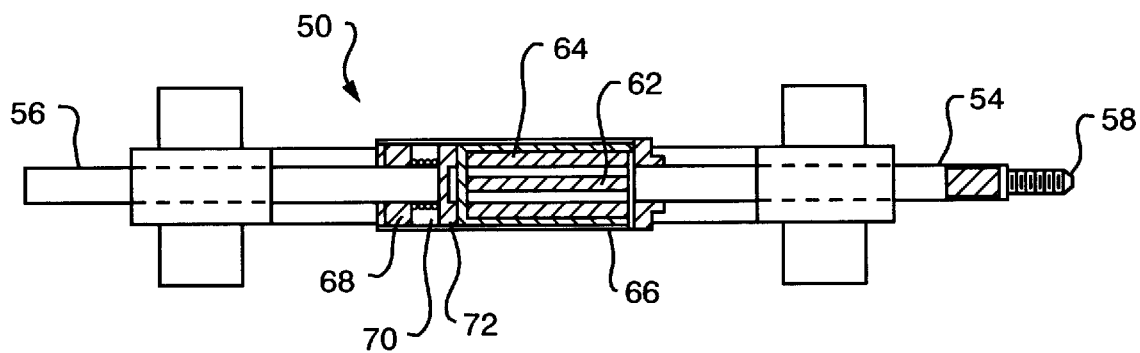
Figure 10C:
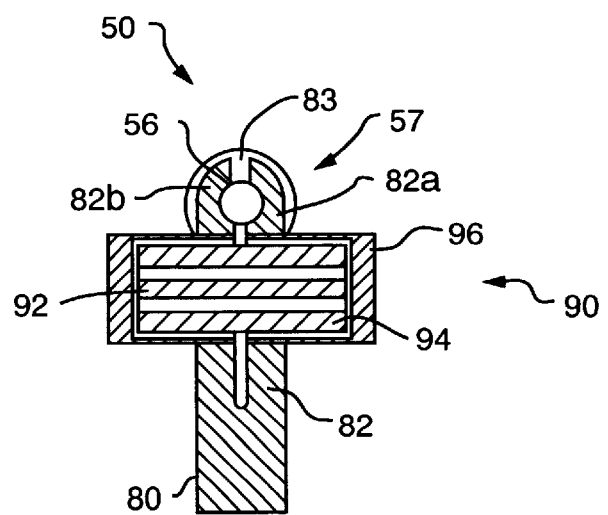
Figure 11:
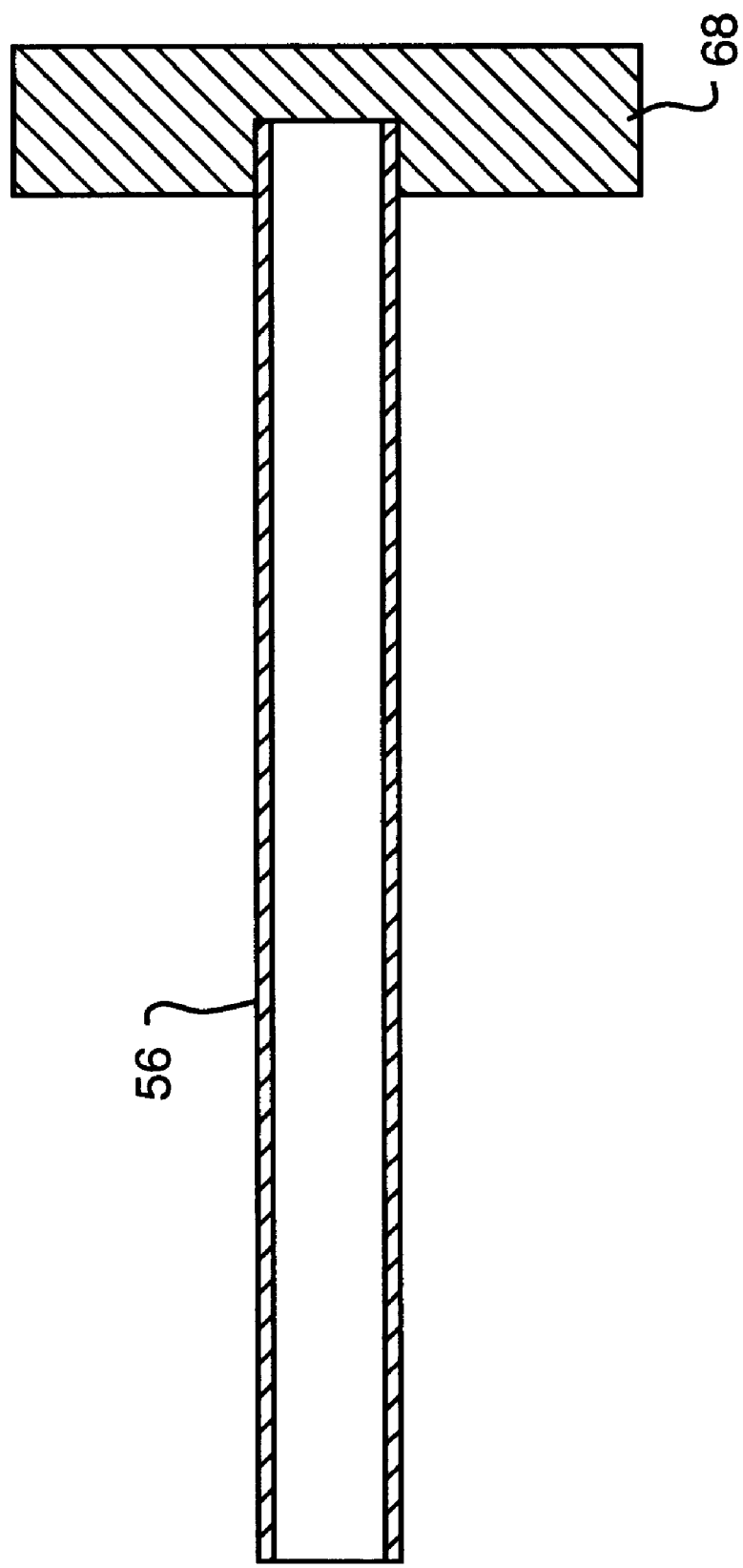
FIG. 11 is a cross-sectional diagram of the traveler rod sub-assembly of the linear motor of FIG. 10.
Figure 12:
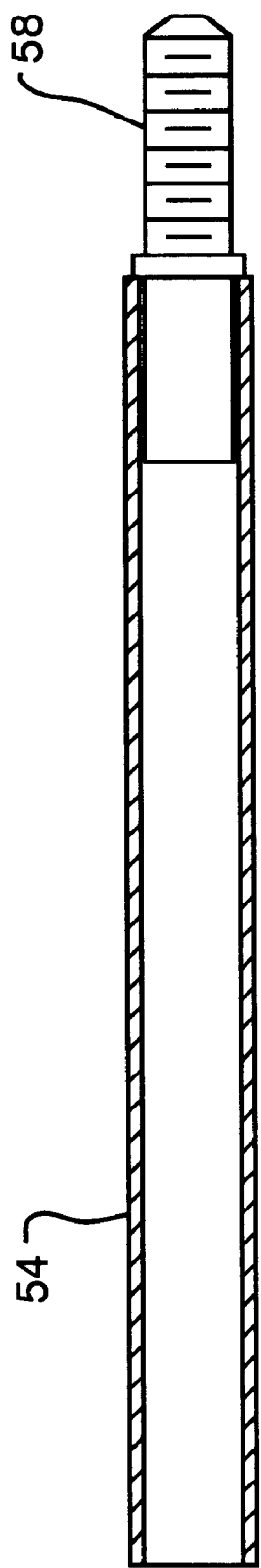
FIG. 12 is a cross-sectional diagram of the translator sub-assembly of the linear motor of FIG. 10.
Figure 13:
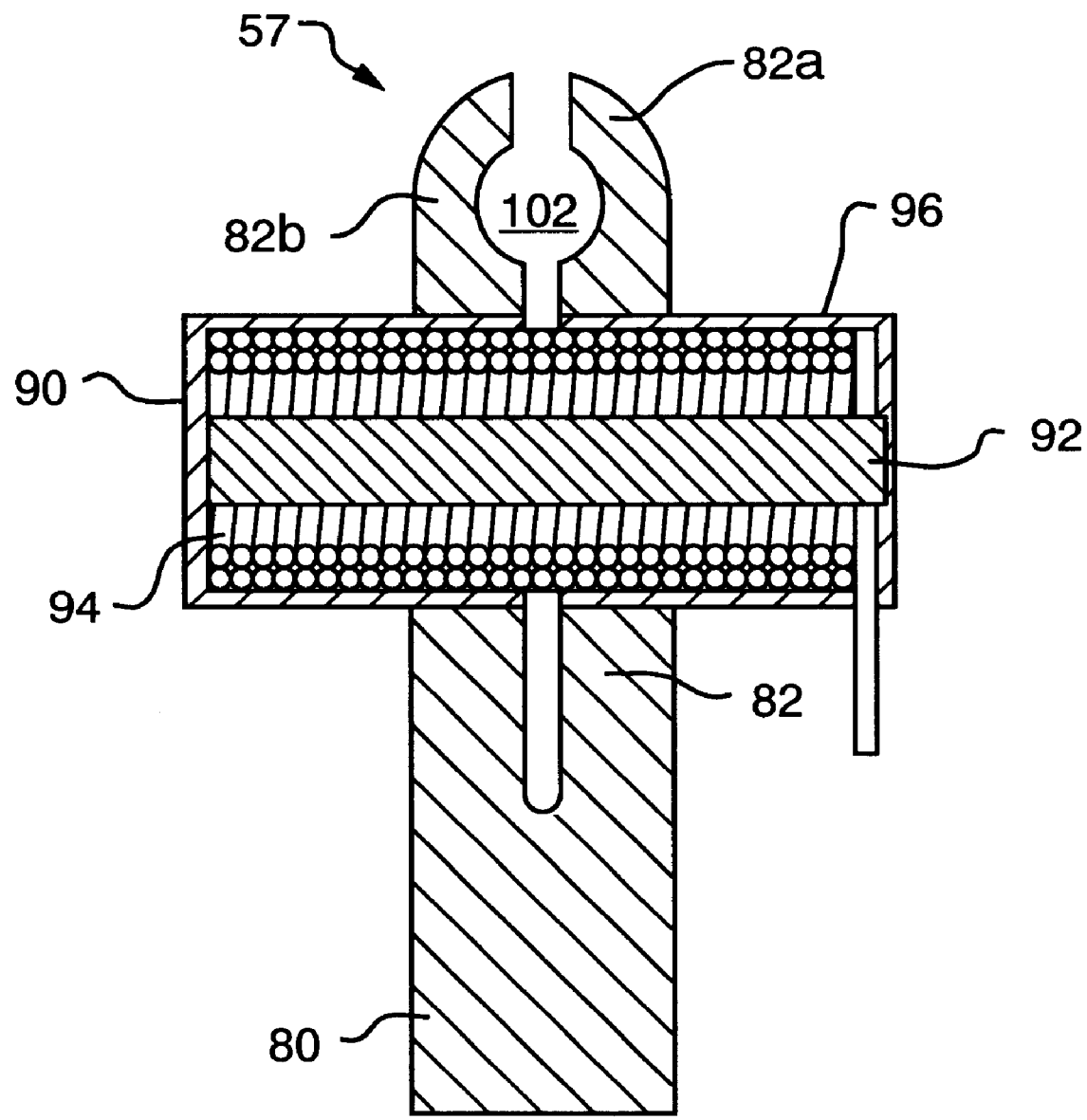
FIG. 13 is a cross-sectional diagram of one of the clamp assemblies of the linear motor of FIG. 10.

Another embodiment of this invention features a linear stepper motor that moves a mechanical member such as a shaft along its axis in discrete steps. The preferred embodiment of this motor includes an actuator which consists of a shaft held by a pair of releasable clamps, which may themselves be magnetostrictively-actuated. The motor may include a linear actuator similar to the actuator described above, with mechanical members (e.g. connecting rods) extending from each end. The clamps releasably hold on to the mechanical members. These clamps are opened by energizing the actuator contained therein, thereby enabling the mechanical member to move. FIGS. 10A–C are assembly drawings of an embodiment of such a linear motor 50, and FIGS. 11–13 are portions of the linear motor of FIG. 10.

The translating rod 52 is identical to the actuator 10 (with magnetostrictive member 62, coil 64, case 66, spring 70, lead screw 68, and cap 72), except that it has two protruding connecting rods 54, 56, one extending from each end. Connecting rod 54 carries actuating member 58 (shown as threaded to provide an adjustable length). When this actuator is energized, the magnetostrictive member 62 elongates, separating the connecting rods from each other.

Clamps 55, 57 (FIG. 13), each consist of a precision aluminum flexure 80 with a shaft-receiving opening 102 between flex arms 82*a* and 82*b* of clamping portion 82, which provides an interference fit to the translating rod. The clamp geometry is selected such that there is a substantial holding force by friction between the clamp and rod interface. A magnetostrictive actuator 90, 91 (each with magnetostrictive rod 92, coil 94, and case 96) is used to open each clamp, thereby enabling the translating rod to move while the clamp is open. This is accomplished by having split actuator case 96 engaged with arms 82*a* and 82*b*, so that when magnetostrictive member 92 elongates, arms 82*a* and 82*b* are pushed apart, to widen opening 102, and thereby release the shaft. When the power is shut off, the spring force of the arms returns the clamp to a clamping position. The power off position for the clamp is thus closed.

The linear motor can be operated in one of two modes—in stepper mode or fine tune mode. In stepper mode, the translating rod is moved in discrete steps along its axis by operating the clamp and translating actuators in a predefined sequence. The sequence is as follows.

Starting from the power off position:
The forward clamp is energized causing it to release its hold on the connecting rod.
The translating actuator is energized causing the magnetostrictor rod to elongate, pushing the released connecting rod forward.
The open clamp is then closed, to grab onto rod.
The other clamp is energized, to release the other connecting rod.
The translating actuator is de-energized, causing the other connecting rod to be pulled forward.
The other clamp is closed, to provide maximum holding.
The rod has moved a step forward. Reversing the sequence of operations above causes the rod to move in the opposite direction.

To achieve a high positioning resolution, a fine tuning mode of operation is provided in the preferred embodiment. In this mode, the forward actuator is energized to release the forward rod, and the current in the translating actuator is varied, thereby moving the forward connecting rod proportionally, any distance up to a full step. This mode of operation is similar to the operation of the actuator described above.

Thus this actuator is capable of providing a long stroke with high positioning resolution. It is capable of holding position with zero power dissipation since the clamps hold at zero current.

Figure 14A:
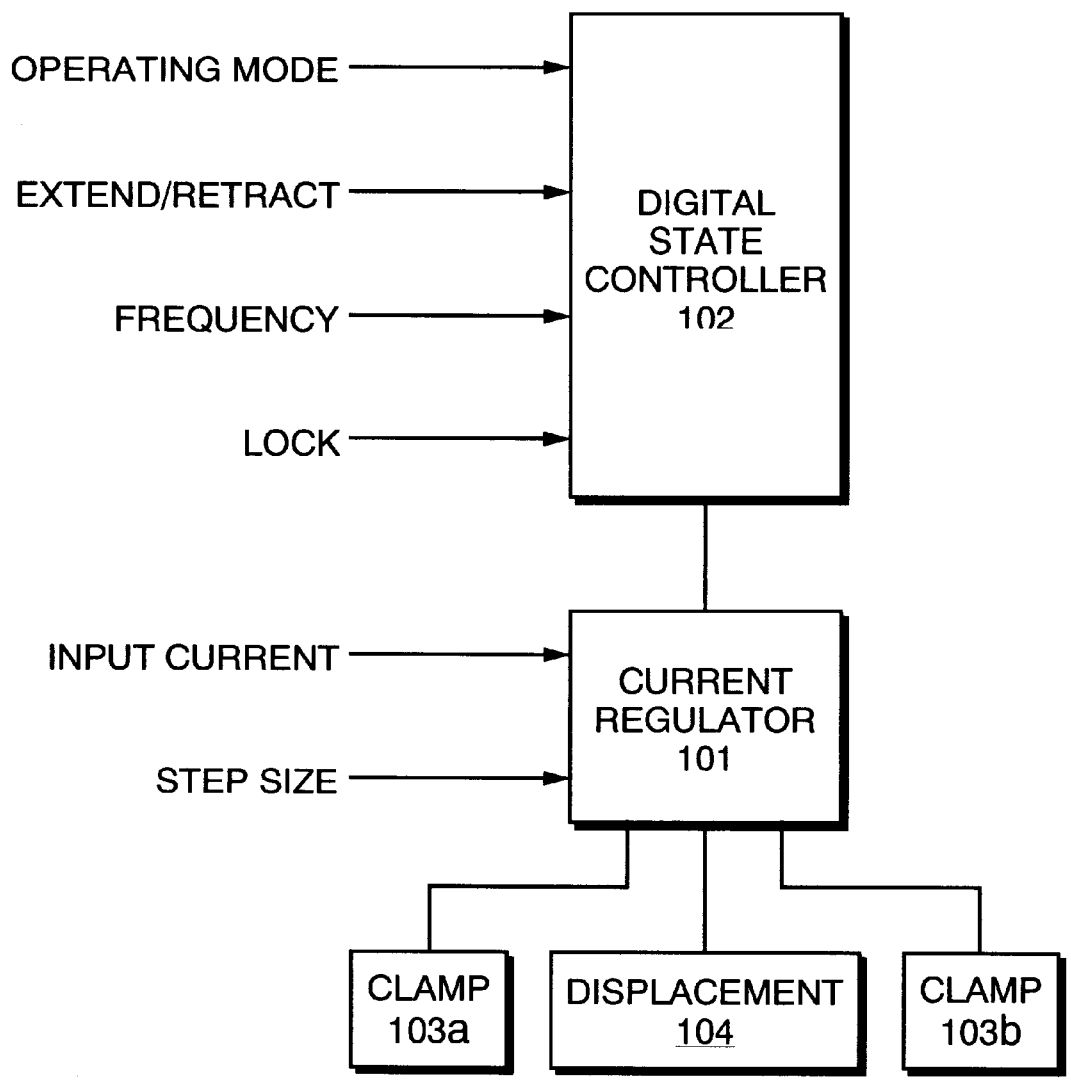
FIG. 14A is a block diagram of the digital state control circuit for the linear motor of FIG. 10.

The drive electronics for the linear motor (which can be used as a position control actuator) enables a wide range of actuator operational flexibility through a digital state control circuit. In addition to setting the operating mode (stepper or fine tune), the direction of motion, the step size and stepping frequency (e.g., in steps per second) can be adjusted. FIG. 14A is a block diagram of the drive electronics.

To achieve accurate stepping and fine tuning, the current flowing through the translating actuator must be tightly regulated. The current regulator 101 has an internal feedback loop that provides 10 ppm current regulation relative to a setpoint. The current drives for the clamps 103*a* and 103*b* do not need to have the tight regulation or control capability as does the current drive for the translating actuator 104, since the clamps operate in a digital mode (on or off).

The clamp actuators require a simple on-off operation. Therefore, to reduce the complexity of the actuator drive electronics, the clamps can be driven by a gated current source of prescribed magnitude. This can be achieved by gating a MOSFET with a clamped gate-to-source potential such that it is forced into its constant saturated drain current regime.

The clamp actuators are energized and de-energized by logic drive signals from the state machine. MOSFET elements are used as gated current sources to drive the associated actuator coil during the stepping sequence. A Schottky rectifier is utilized as a freewheeling path for inductive current to prevent large negative voltage swings on the MOSFET regulator source lead upon turn-off.

The current in the translating rod actuator is sequenced on and off when the actuator is operated in the stepping mode. Under this operating mode, the step size is determined by the amplitude of the current applied to the coil. This current amplitude is controlled by an external input to the drive electronics.

Under fine tuning mode, the current drive for the translating rod actuator must be modulated accurately to provide the necessary positioning resolution. The drive electronics for this actuator is the same as for the actuator 10, as described in FIG. 4.

Figure 14B:
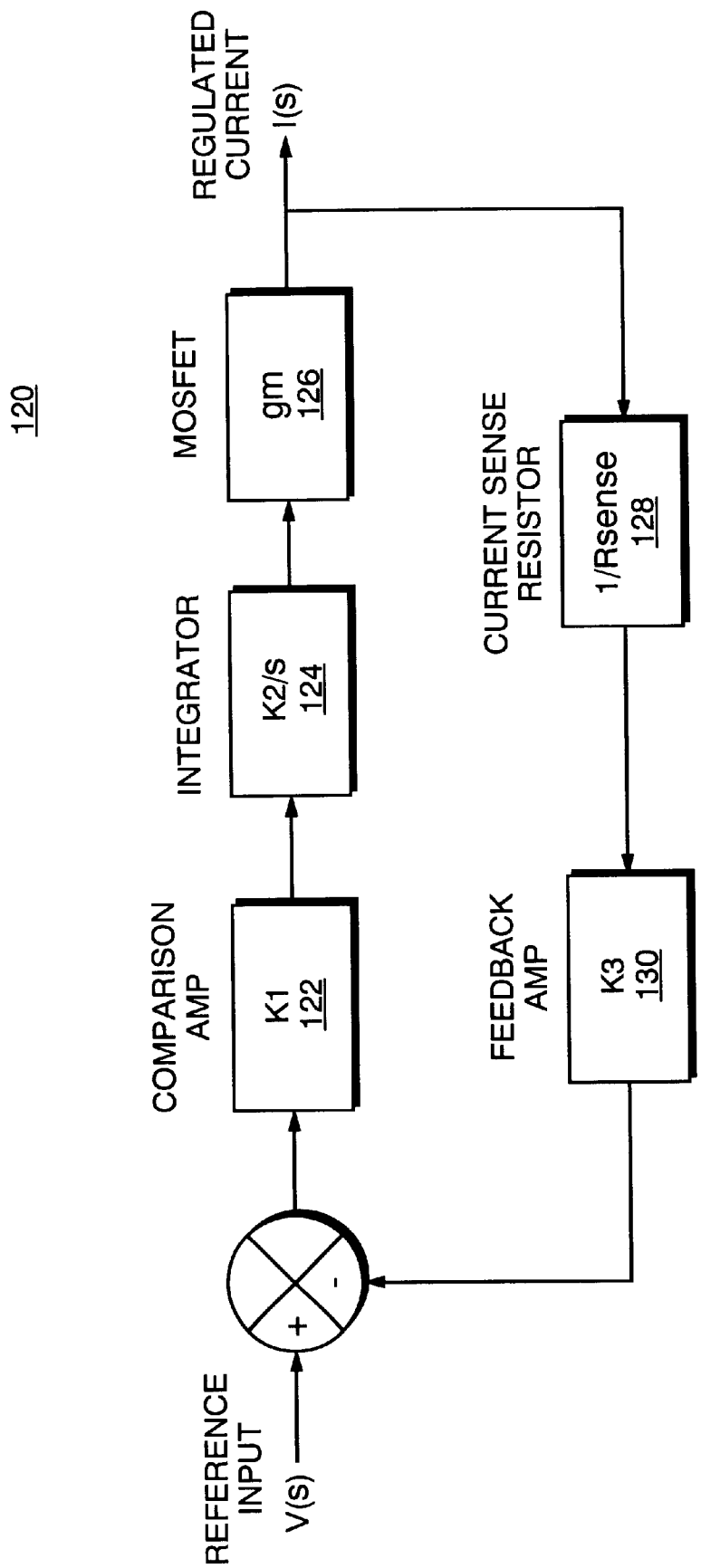
FIG. 14B is a block diagram of the translating actuator drive for the linear motor of FIG. 10.

A block diagram of the current regulator 120 for the translating actuator is shown in FIG. 14B. Its major functional components consist of a comparison amplifier 122, an integrating amplifier 124, a MOSFET series pass regulator element 126, the actuator coil (not shown), a current sense resistor 128, and a feedback current sense amplifier 130. Auxiliary functionality includes an overcurrent protection circuit and associated power switch, not shown. Note that the dual mode operation of the center actuating element in the positioner is achieved by either switching the input reference under the control of the state machine drive signal, or applying it continuously with the variable set point determining the step size.

The step size setpoint is calibrated in span such that a zero to full scale command corresponds linearly to a zero to full scale regulated current in the actuator. Although the relationship between current and actuator stroke is not necessarily linear over the full range, one may develop by calibration a relationship between setpoint input and stroke of the actuating element.

The translating actuator along with its current regulator circuit exhibits first order dynamics. The current regulator circuit is designed with a high loop gain. As a result, forward path disturbances are reduced by a factor equal to the loop gain, whereas feedback path disturbances are reflected directly to the output. Loop gain in the current regulator is approximately $5 \times 10^4$ to meet resolution requirements, and one pure integration element is used in the forward path to achieve zero steady state error for a step change in set point adjustment. Thus, forward path disturbances to the output current such as forward gain and offset drift, and variation in the input source potential for the actuator coil, are reduced by the loop gain to insignificant levels.

Critical to low drift is the stability of the feedback path elements with temperature and time. These elements are the current sense resistor and the gains and offset of all electronic amplifiers and components that develop the feedback signal. To this end, the design includes an autozeroing chopper stabilized CMOS amplifier for the current sense signal. With all gains set by the ratio of resistors exhibiting identical temperature coefficients, gains in the feedback path are effectively unchanged. The remaining source of span drift is the temperature coefficient of the sense resistor, which can be compensated for directly by a temperature dependent gain introduced into the feedback path.

A digital state controller defines the step rate, direction of motion and the mode of operation. While this state controller may be implemented in CMOS logic, the simplest implementation is via a programmable logic device or a fully static microcontroller suitable for operation at 20K to 60K. A PIC series microcontroller running on a 4 MHz ceramic resonator can be used. In cryogenic temperature operation, the resonator would have to be substituted with a crystal to permit operation. The logic machine has as its inputs four control bits corresponding to a logic enable, a direction selection bit, a speed select bit, and a mode select bit. The step size input is an analog set point reference for the center actuator element's current regulator, although it would be possible to make this a bit selectable set point corresponding to one of two step sizes. The control bits are internally pulled up to the regulated supply rail of the microcontroller, and may be pulled low by a CMOS level current sinking device. The state controller outputs are the three output logic drive lines for the three magnetostrictive elements. These logic outputs enable the appropriate current pulses to be applied to the actuator elements in the sequence necessary to achieve the desired motion of the positioner.

The linear motor is designed to hold position under power off conditions. Therefore, it is possible to use a single set of drive electronics to control multiple actuators. This would result in significant power and weight savings. The optimal scheme will be dependent upon system issues such as computer control ports and bandwidth available. Likewise, multiplexing may necessitate a modification of the current sense resistor location in the regulator loop to permit above ground sensing, in order to reduce the number of power buss switching lines; i.e., if the actuator elements all had one end terminated at supply ground, all actuators would have a common buss connection, and only the current source line of the regulator would need to be switched. It is not clear that the number of power MOSFET devices would necessarily be reduced by multiplexing, as these devices would be required to switch the actuator currents. Multiplexing may reduce the control electronics requirements by a significant factor. One method of multiplexing which is possible is to use multiplexed steering of the current regulator gate drive signal to the desired regulator MOSFET element associated with each actuator element.

Figure 15:
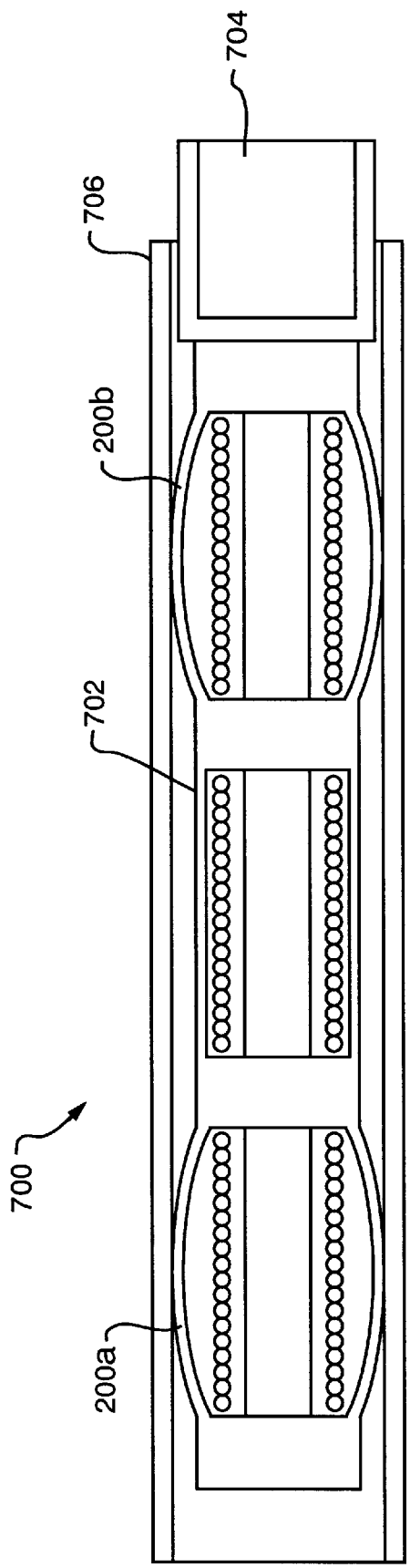
FIG. 15 is a schematic cross-sectional drawing of another embodiment of a linear motor according to this invention.

FIG. 15 shows an alternative embodiment of linear motor 700 according to this invention. Motor 700 includes actuator 702, and locking actuators 200a and 200b. The operation of this embodiment is the same as that of FIG. 10, in that the motor can move left or right in discrete steps, or in a more continuous fashion, to move the mechanical member 704 accordingly. Actuators 200 lock by gripping and releasing the inside of tube 706.

Figure 16:
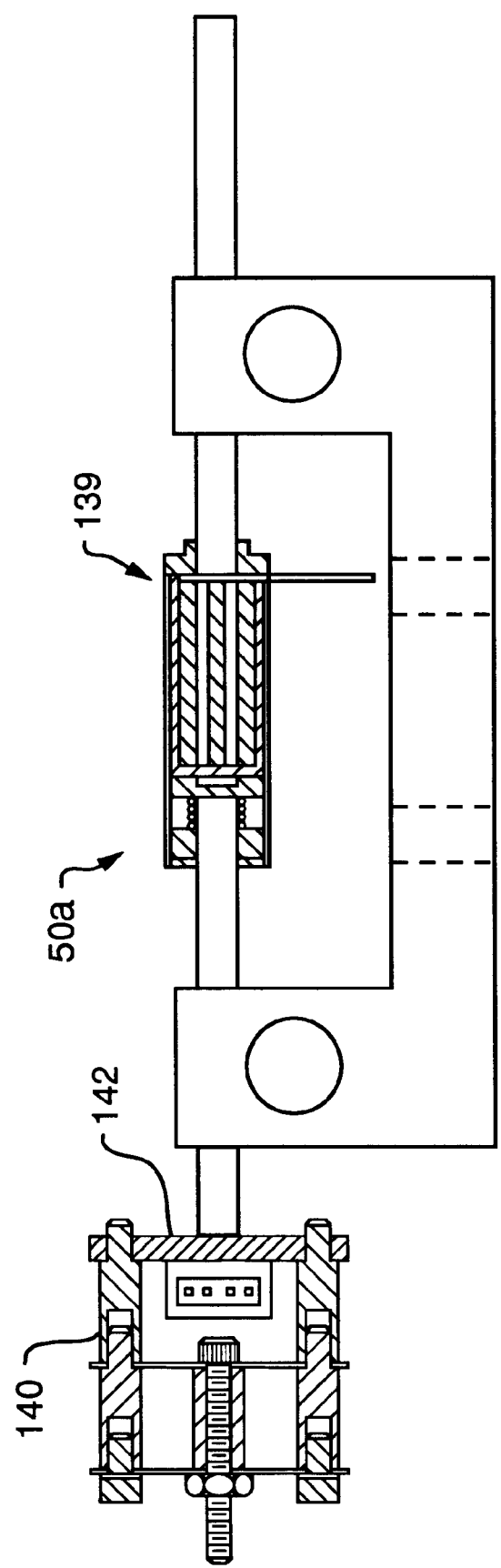
FIG. 16 is a side, cross-sectional view of a force actuator according to this invention.
Figure 17:
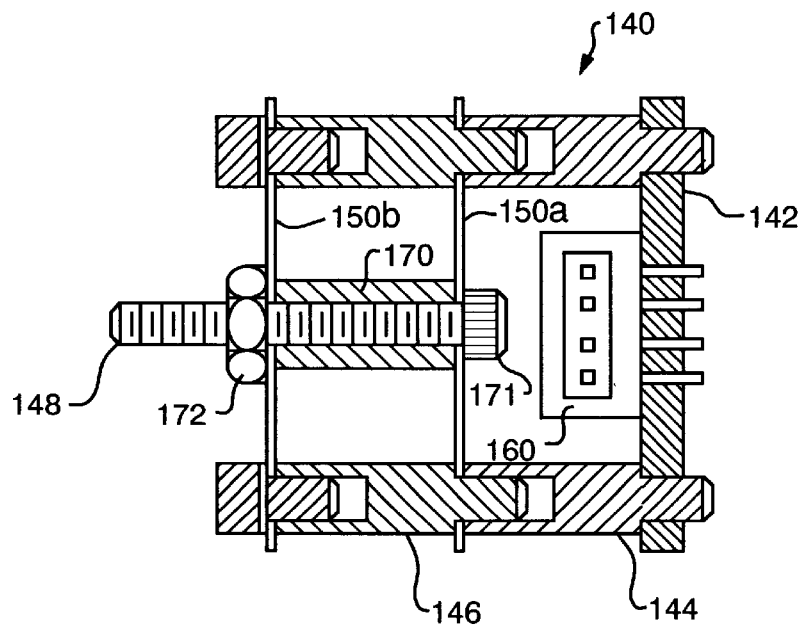
FIG. 17 is a detailed, cross-sectional view of the force spring assembly of the force actuator of FIG. 16.
Figure 18:
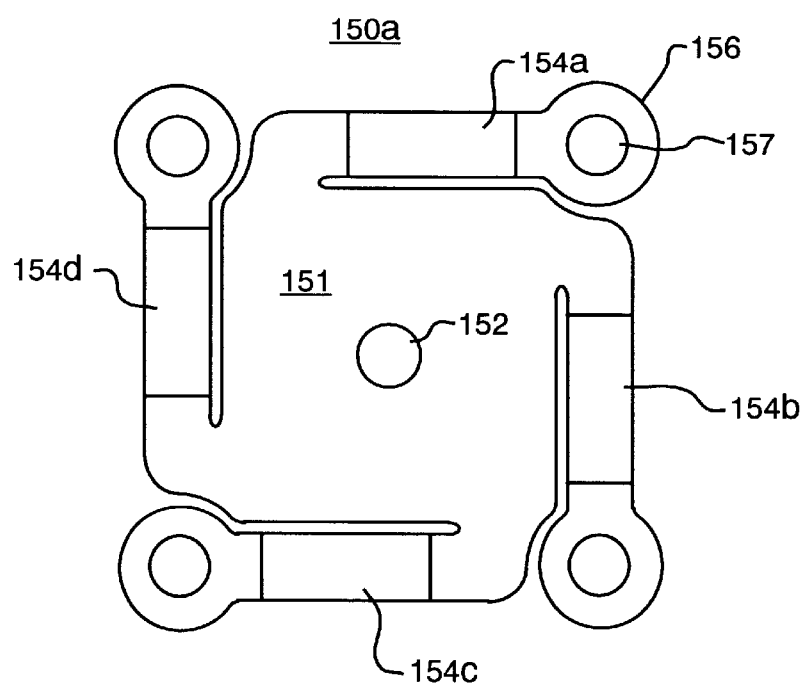
FIG. 18 is a top view of one of the flat springs of the force actuator of FIG. 16.

Another embodiment of this invention is a force control actuator 139, FIGS. 16–18. A force control actuator is contemplated for use in the NGST, to be mounted in the center of the mirror surface to provide first order curvature correction. Because the hexapod mirror mounts may provide tip, tilt and piston motion for the entire mirror segment, the physical distance between the center of the mirror and the back structure can vary several millimeters, and so the force control actuator must accommodate these variations. Thus the force control actuator must provide the necessary range of force independent of the position of the actuator.

Force control actuator 139 consists of a magnetostrictive actuator, for example linear stepper motor 50a of the type described above, with a flat spring assembly 140 attached between the connecting rod and the mirror surface. However, the position control-type actuator could alternatively be used to provide the necessary motion. The flat spring assembly contains a load sensor that provides internal feedback for maintaining the setpoint force. FIG. 16 shows an assembly drawing of an embodiment of the force control actuator of this invention. The linear stepper motor provides a long stroke (19.5 mm) with a high positioning resolution. The load cell/flat spring assembly 140 converts the displacement into a force through the use of a precision flat spring.

The linear stepper motor moves a shaft along its axis in discrete steps. The actuator consists of a shaft held by a pair of magnetostrictive clamps and a translating actuator shaft assembly. The design and operation of the linear stepper motor is described above, and will not be repeated here.

The linear stepper motor operates on a flat spring assembly, which converts displacement into a force through a controlled precision spring rate. FIG. 17 is an assembly drawing of the flat spring assembly 140. The assembly consists of two flat square springs 150a and 150b (shown in detail in FIG. 18) that are mounted on four corner posts (posts 144, 146 shown in the drawing), to a baseplate 142. The baseplate 142 connects to the linear stepper motor shaft by a machine screw, not shown. A center structure 148 is attached to the centers of the two flat springs, and connects to the mirror surface. The design of the flat spring assembly provides a controlled axial force capability with excellent lateral stability.

The flat spring assembly is precisely designed for a spring constant of 65,300 N/m. As will be described in greater detail below, the flat spring assembly is designed to impose a force of ±8.0 N force on the mirror. The deflection of the flat springs is approximately ±0.122 mm relative to the baseplate. Note that the stroke of the linear stepper motor is 19.5 mm which enables the force control actuator to follow the motion of the mirror through the tip, tilt and piston motions that are necessary for mirror segment phasing. For other applications, with small required displacements, a different actuator design (such as actuator 10, FIG. 1), maybe used instead of a linear motor.

The flat springs serve two mechanical functions. First, they provide the desired spring constant to translate the displacement into a force. And second, they provide a high degree of lateral stability to the center shaft. This is essential for ease of installation of these actuators in the NGST, and for minimizing any impact of launch vibrations on the actuator operations.

FIG. 18 shows the geometry of the flat springs. The basic geometry consists of four cantilevered beams or arms 154a–d that connect the corner posts to the center post, which fits into opening 152 in central spring body 151. These beams are designed to flex vertically but provide high lateral stability. The springs are fabricated from type 304 stainless steel using electrical discharge machining to achieve the precision geometric uniformity, and then etched and lapped to a predetermined thickness.

Figure 19:
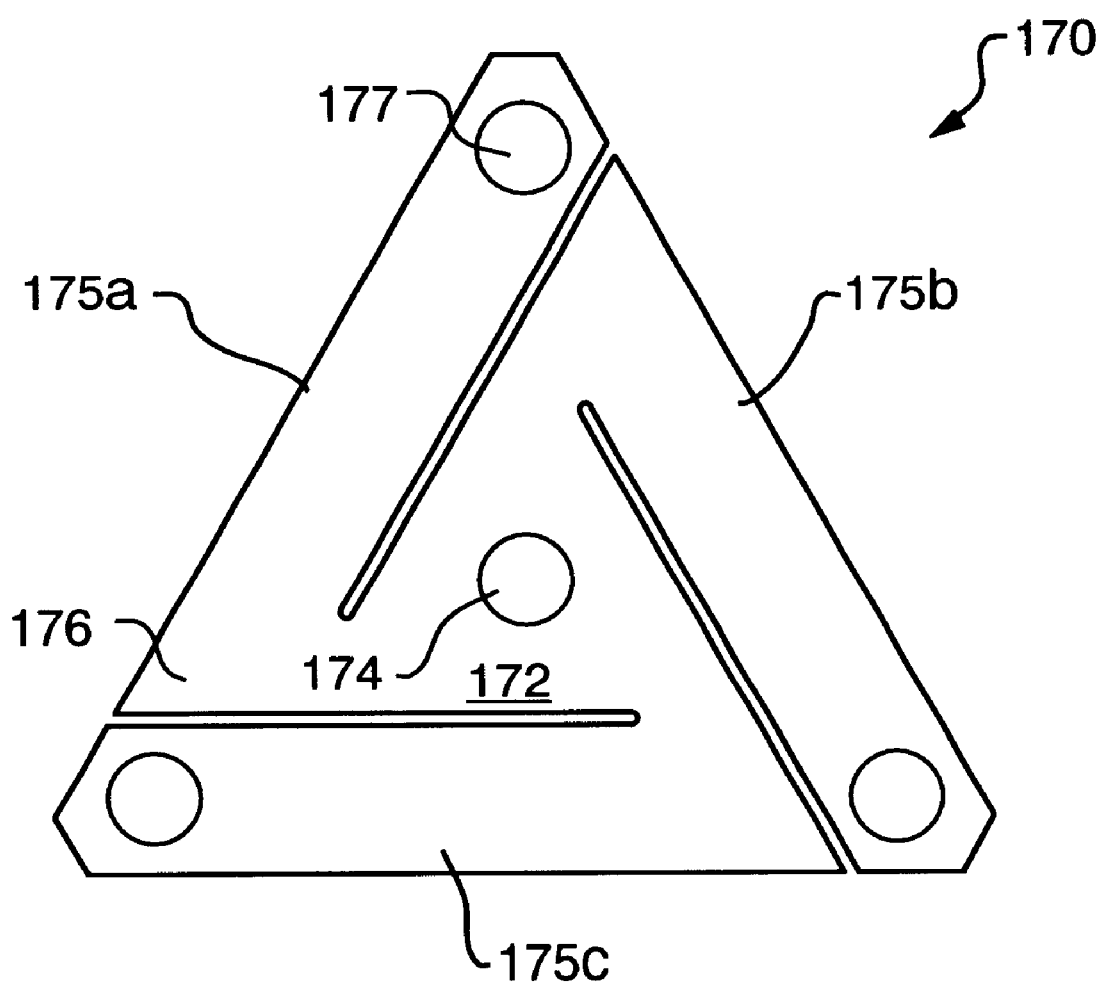
FIG. 19 is a similar view of an alternative embodiment of the flat spring.

This particular shape and spring design is not a limitation of the invention, as other spring types can be used, one example of which is shown in FIG. 19, in which flat spring 170 has central portion 172 with receiving opening 174, and three extending arms 175a–c.

The flat spring contains a load cell (not shown) consisting of a complete bridge strain gauge built onto the flat surface. The bridge is fabricated using standard deposition techniques used in the semiconductor processing industry. After machining and polishing of the stainless steel spring, a sapphire coating is sputter deposited on the spring. This coating provides electrical isolation between the stainless steel and subsequent layers. A thin layer of nickel-chromium is sputtered on the sapphire surface. This surface is laser etched with the desired pattern of strain gauges. For this design, 20,000 Ohm strain gauges are patterned on each of the four arms of the flat spring. These strain gauges are then connected electrically in a bridge configuration with the mounting posts serving as the electrical connections for excitation and sensing of the bridge output.

The drive electronics for the force control actuator uses the strain gauge bridge to sense the force. A sample and hold circuit measures the force periodically with the load cell mounted on the flat spring. This sampling technique is used to minimize heating in the actuator. A feedback comparator then moves the linear stepper motor appropriately to reduce force error. Connection is made through connector 160.

The linear stepper motor can move in both stepper and fine tune mode. In stepper mode, the motor moves in discrete steps. The motor then switches to fine tune mode where a position resolution of 10 nm can be achieved corresponding to a force resolution of 0.653 mN.

Although specific features of this invention are shown in some drawings and not others, such is not a limitation, as the features may be combined as apparent to those of skill in the field.

Other embodiments will occur to those skilled in the art and are within the following claims:

What is claimed is:

1. A magnetostrictive precision force applicator, comprising:
   a magnetostrictive member which elongates upon application of a magnetic field;
   a translating member mechanically coupled to said magnetostrictive member, for translating the change in length of said magnetostrictive member into a desired action; wherein said translating member includes a flat spring with a plurality of spring arms emanating from a central spring body, and means for mechanically coupling said magnetostrictive member to the distal ends of said spring arms, and a mechanical member coupled to said central spring body, for providing force to an external body, all for translating the change of length of said magnetostrictive member into a force output;
   means for controlling said magnetostrictive member to provide a desired force; wherein said means for controlling includes means for sensing the force output, and means, responsive to said means for sensing, for controlling the field strength of said applied magnetic field; and
   means for selectively applying a magnetic field, including an electrical coil surrounding said magnetostrictive member, and means for applying a selected current to said coil, to generate an electromagnetic field with a selected field strength.

2. A magnetostrictive actuator, comprising:
   a magnetostrictive member which elongates upon application of a magnetic field;
   a translating member mechanically coupled to said magnetostrictive member, said translating member including a flat spring for translating displacement of said magnetostrictive member into a force output; and
   means for selectively applying a magnetic field to said magnetostrictive member, to selectively change the length of said magnetostrictive member and thereby cause said translating member to create said desired action.

3. The magnetostrictive actuator of claim 2 in which said flat spring includes a plurality of spring arms emanating from a central spring body.

4. The magnetostrictive actuator of claim 3 in which said means for translating further includes means for mechanically coupling said magnetostrictive member to the distal ends of said spring arms.

5. The magnetostrictive actuator of claim 4 in which said means for translating further includes a mechanical member coupled to said central spring body, for providing force to an external object.

6. A magnetostrictive actuator, comprising:
   a magnetostrictive member which elongates upon application of a magnetic field;
   a translating member mechanically coupled to said magnetostrictive member, said translating member including means for translating the change in length of said magnetostrictive member into a force output;

means for selectively applying a magnetic field to said magnetostrictive member, to selectively change the length of said magnetostrictive member and thereby cause said translating member to create said desired action; and means for controlling said magnetostrictive member to provide a desired force, said means for controlling including means for sensing the force output, and means, responsive to said means for sensing, for controlling the field strength of said applied magnetic field.

* * * * *